United States Patent  (10) Patent No.: US 8,624,674 B2
Forel et al. (45) Date of Patent: Jan. 7, 2014

(54) OUTPUT STAGE OF A CLASS-A AMPLIFIER (75) Inventors: Christophe Forel, Grenoble (FR); Roland Mazet, Claix (FR)

(73) Assignee: STMicroelectronics (Grenoble 2) SAS, Grenoble (FR)

(*) Notice: Subject to any disclaimer, the term of this patent is extended or adjusted under 35 U.S.C. 154(b) by 0 days.

(21) Appl. No.: 12/878,486

(22) Filed: Sep. 9, 2010

(65) Prior Publication Data

US 2011/0063033 A1 Mar. 17, 2011

(30) Foreign Application Priority Data

Sep. 17, 2009 (FR) ...................... 09 56407

(51) Int. Cl.
*H03F 3/16* (2006.01)
(52) U.S. Cl.
USPC .......................................... 330/277; 330/298
(58) Field of Classification Search
USPC .................. 330/277, 253, 296, 298
See application file for complete search history.

(56) References Cited

U.S. PATENT DOCUMENTS

| | | | |
|---|---|---|---|
| 4,241,316 A * | 12/1980 | Knapp | 330/277 |
| 5,696,459 A | 12/1997 | Neugebauer et al. | |
| 6,018,267 A | 1/2000 | Tran et al. | |
| 7,030,654 B2 | 4/2006 | Mentze et al. | |
| 7,061,298 B2 | 6/2006 | Mentze et al. | |
| 7,112,995 B2 | 9/2006 | Mentze et al. | |
| 7,786,807 B1 * | 8/2010 | Li et al. | 330/311 |
| 2005/0110574 A1 | 5/2005 | Richard et al. | |

OTHER PUBLICATIONS

French Search Report dated Apr. 30, 2010 from corresponding French Application No. 09/56407.
Jung-Sheng Chen et al., *Impact of MOSFET Gate-Oxide Reliability on CMOS Operational Amplifiers in a 130-nm Low-Voltage CMOS Process*, Reliability Physics Symposium, 2005, Proceedings, 43rd Annual, 2005 IEEE International San Jose, CA Apr. 17-21, 2005, pp. 423-430 XP010826936.
Founds, J.E., et al. "High-Voltage Series MOSFET Output Driver for nanometer Technologies", 5th International Planetary Probe Workshop (IPPW-5), Bordeaux, France, Jun. 2007.

* cited by examiner

*Primary Examiner* — Robert Pascal
*Assistant Examiner* — Khiem Nguyen
(74) *Attorney, Agent, or Firm* — Wolf, Greenfield & Sacks, P.C.

(57) ABSTRACT

An output stage of an integrated class-A amplifier in a technology adapted to a first voltage and intended to be powered by a second voltage greater than the first one, including: one or several transistors of a first channel type between a first terminal of application of the second voltage and an output terminal of the stage; transistors of a second channel type between this output terminal and a second terminal of application of the second voltage, wherein: a first transistor of the second channel type has its gate directly connected to an input terminal of the stage; at least a second and a third transistors of the second channel type are in series between the output terminal and said first transistor, the gate of the second transistor being connected to the midpoint of a resistive dividing bridge between said output terminal and the gate of the third transistor, and the gate of the third transistor being biased to a fixed voltage.

33 Claims, 4 Drawing Sheets

OUTPUT STAGE OF A CLASS-A AMPLIFIER

CROSS REFERENCE TO RELATED APPLICATIONS

This application claims the priority benefit of French patent application number 09/56407, filed on Sep. 17, 2009, entitled "OUTPUT STAGE OF A CLASS-A AMPLIFIER," which is hereby incorporated by reference to the maximum extent allowable by law.

BACKGROUND OF THE INVENTION

1. Field of the Invention

The present invention generally relates to electronic circuits and, more specifically, to so-called class-A amplifiers.

The present invention more specifically applies to audio or audio/video signal processing chains.

2. Discussion of the Related Art

In most audio or audio/video devices, signals received by an antenna, extracted from a tape, from a CD/DVD, etc. are, possibly after reprocessing, amplified to be exploited by a reproduction device (television, home cinema, etc.) equipped with a decoder. Most often, the signals transit from one device to another through SCART connectors while respecting levels set by standards or are, within a device, conveyed in compliance with the levels provided by such standards. For audio signals, a DOLBY standard sets the maximum deviation of audio signals to 2 volts RMS (approximately 5.6 volts peak to peak).

Figure 1:
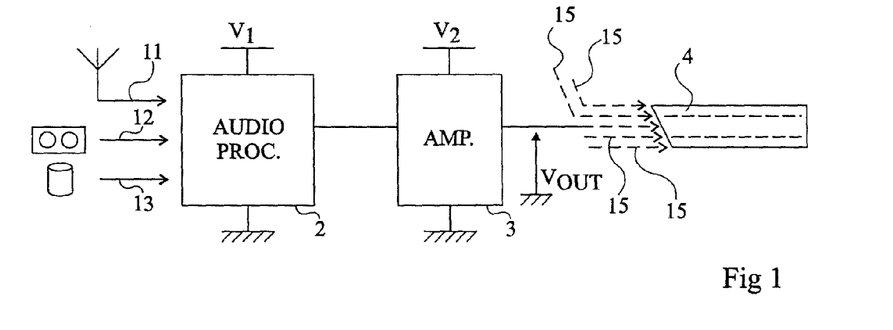
FIG. 1, previously described, schematically shows in the form of blocks an example of an audio signal processing chain of the type to which the present invention applies.

FIG. 1 is a simplified representation of a processing chain of the type to which the present invention applies as an example.

In this example, audio signals originating from an antenna 11, from a video tape 12, or from a digital system 13 are processed by one or several circuits 2 (AUDIO PROC.) before being amplified (block 3, AMP.) to be delivered to a SCART connector 4. The processings (demodulation, filtering, path separation, etc.) performed by circuits 2 are different according to the audio source but the signal(s) provided by circuit 2 need however all to be amplified to respect the DOLBY standard at the output. Other audio or video signals reach SCART connector 4 (arrows in dotted lines 15). These signals originate from parallel processing paths. For stereo signals in particular, left-hand and right-hand paths are amplified separately (while possibly sharing a same upstream circuit 2).

Processing function 2 and amplification function 3 are generally performed by circuits powered by different voltages $V_1$ and $V_2$ ($V_2$ being greater than $V_1$) and also made in different technologies, that is, with transistors capable of standing different voltages. In the example of the DOLBY standard, voltage $V_2$ is on the order of 8 volts while the processing circuits are powered under a smaller voltage $V_1$, for example, on the order of 3.3 volts. For simplification, reference will be made hereafter to high and low voltages, but these voltages still are of the same order of magnitude (one does not switch from a low voltage of a few volts to a high voltage of some hundred volts).

It would be desirable to be able to integrate the entire processing chain within the same integrated circuit. However, manufacturing this circuit with the technology adapted to the highest voltage adversely affects the bulk and generates unnecessary power consumption in the processing portion.

It would thus be desirable to make the amplifier in the low-voltage technology. But this poses the problem that low-voltage technology transistors cannot withstand the high voltage required to provide the amplified signal with the desired output voltage swing.

SUMMARY OF THE INVENTION

An object of an embodiment of the present invention is to provide a class-A amplifier, and more specifically an output stage of such an amplifier, in a technology where transistors withstand a voltage smaller than the amplifier power supply voltage.

Another object of an embodiment of the present invention is to provide a signal processing and amplification chain that may be integrated in a technology of transistors only withstanding a voltage smaller than a power supply voltage of the amplifier output stage.

Another object of an embodiment of the present invention is to provide a solution more specifically adapted to the forming of a class-A amplifier complying with the DOLBY standard.

To achieve all or part of these objects as well as others, at least one embodiment of the present invention provides an output stage of an integrated class-A amplifier in a technology adapted to a first voltage and intended to be powered by a second voltage greater than the first one, comprising:

one or several transistors of a first channel type between a first terminal of application of the second voltage and an output terminal of the stage;

transistors of a second channel type between this output terminal and a second terminal of application of the second voltage, wherein:

a first transistor of the second channel type having its gate directly connected to an input terminal of the stage;

at least a second transistor and a third transistor of the second channel type are in series between the output terminal and said first transistor, the gate of the second transistor being connected to the midpoint of a resistive dividing bridge between said output terminal and the gate of the third transistor, and the gate of the third transistor being biased to a fixed voltage.

According to an embodiment of the present invention, two capacitive elements in series connect the input terminal to the output terminal, a resistive dividing bridge connecting the output terminal to the second terminal of application of the second voltage and having its midpoint connected to the junction point of the two capacitive elements.

According to an embodiment of the present invention, a fourth transistor of the second channel type is interposed between the first and third transistors.

According to an embodiment of the present invention, the transistor(s) of the first channel type form a current source between said first terminal of application of the second voltage and the output terminal.

According to an embodiment of the present invention, said current source comprises at least one first transistor of the first channel type, of DRIFT type.

According to an embodiment of the present invention, said first transistor of the first channel type is cascode-connected to at least one second transistor of the same type.

According to an embodiment of the present invention, several transistors of the first channel type are in series between the first terminal of application of the second voltage and the output terminal, at least one of these transistors having its gate connected to the midpoint of a resistive dividing bridge connected between the gate of the neighboring transistors of the series association and the output terminal.

The present invention also provides a class-A amplifier, comprising such an output stage.

The present invention also provides an audio signal processing chain comprising, for each path, such a class-A amplifier.

The foregoing objects, features, and advantages of the present invention will be discussed in detail in the following non-limiting description of specific embodiments in connection with the accompanying drawings.

DETAILED DESCRIPTION

The same elements have been designated with the same reference numerals in the different drawings. For clarity, only those elements which are useful to the understanding of the present invention have been shown and will be described. In particular, the origin and the destination of the signals processed by the amplifier about to be described have not been detailed, the present invention being compatible with any usual application of a class-A amplifier.

Embodiments of the present invention will be described in relation with an example of application to the processing of an analog audio signal. It, however, more generally applies to any amplifier which is desired to be made in a finer technology (with transistors withstanding a lower voltage) than that required for the amplitude of the output signals.

Figure 2:
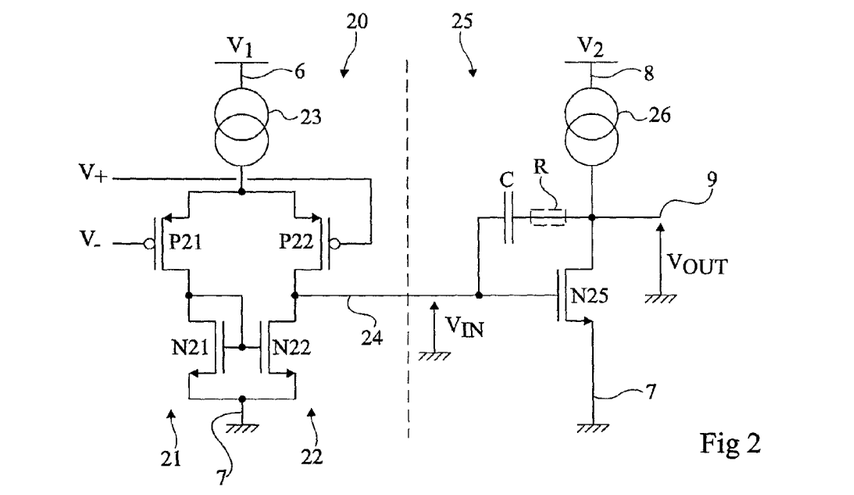
FIG. 2 shows an example of a usual class-A amplifier diagram.

FIG. 2 is a simplified diagram of a usual example of a class-A amplifier.

A differential input stage 20 comprises a current source 23, a differential pair, and an active load in series between two terminals 6 and 7 of application of a power supply voltage $V_1$. Each of two parallel branches 21 and 22 between current source 23 and terminal 7 comprises a P-channel MOS transistor, respectively, P21, P22, and an N-channel MOS transistor, respectively, N21, N22, in series. The respective gates of transistors P21 and P22 define differential inputs V− and V+ of the amplifier. The gates of transistors N21 and N22 are connected to the drain of transistor N21 (interconnection between transistors P21 and N21), transistor N21 being diode-connected. The interconnected drains of transistors P22 and N22 define an output terminal 24 of input stage 20 towards an output stage 25 or amplification stage of the amplifier.

Output stage 25 comprises an N-channel MOS transistor N25 in series with a current source 26 between two terminals 8 and 7 of application of a power supply voltage $V_2$ greater than voltage $V_1$. The drain of transistor N25 (connected to current source 26) defines an output terminal 9 of the amplifier. A capacitive stabilization element C connects the gate of transistor N25 (and thus terminal 24) to its drain (and thus to output terminal 9). A resistor R (shown in dotted lines) may be in series with capacitor C and improves the stability of the amplifier.

Figure 3:
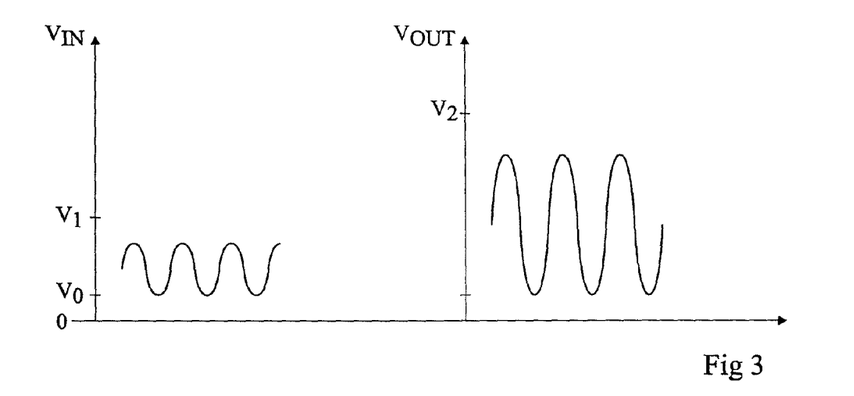
FIG. 3 illustrates the desired amplification function.

FIG. 3 illustrates the operation of the output stage of the amplifier of FIG. 2. Assuming that a sinusoidal signal is applied between inputs V+ and V−, input stage 20 provides a sinusoidal signal $V_{IN}$ between level $V_0$ and level $V_1$ (minus the voltage drops in the transistors of current source 23 and transistors P21 and P22). Level $V_0$ corresponds to the gate-source voltage drop of transistor N21. Signal $V_{IN}$ is amplified by stage 25, which provides a sinusoidal signal $V_{OUT}$ between level $V_0$ and a level slightly lower than level $V_2$ (voltage drop in current source 26). The operation of a class-A amplifier is known.

To integrate such an amplifier, the usual solution is to use a technology adapted to the highest voltage $V_2$. Stages 20 and 25 are then made in this technology while being powered by different voltages.

To integrate the amplifier with the upstream circuits (processing circuits 2, FIG. 1), the technology adapted to voltage $V_2$ results in a too large bulk, and increases the power consumption.

Conversely, the embodiments of the present invention which will be described adapt the output stage of the amplifier so that it can be made in a technology adapted to voltage $V_1$, while being powered with a greater voltage $V_2$.

To simplify the following description, reference will no longer be made to the circuits present upstream of the amplifier and input stage 20 will be considered as symbolizing these upstream circuits. Indeed, this output stage is, like the upstream circuits, powered with the lower-level voltage. In reality, the input stage belongs to the amplifier.

Figure 4:
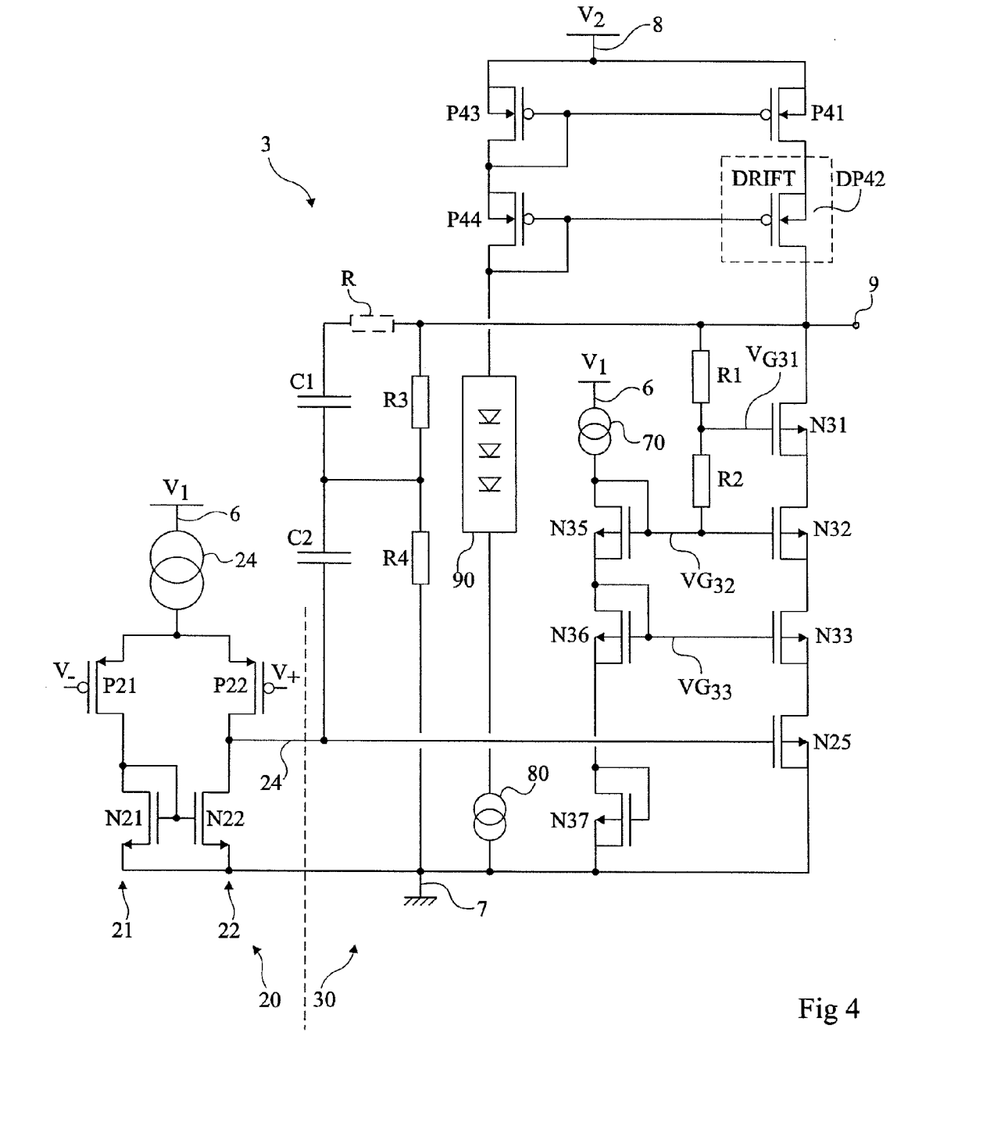
FIG. 4 shows an embodiment of a class-A amplifier.

FIG. 4 shows an embodiment of an amplifier 3 having its output stage 30 intended to be powered under a voltage $V_2$ while being made in a technology adapted to a lower voltage $V_1$. For example, voltage $V_1$ is on the order of 3.3 volts and voltage $V_2$ is on the order of 8 volts.

Input stage 20 of amplifier 3 is not modified with respect to the usual input stages. It for example corresponds to input stage 20 described in relation with FIG. 2.

On the output stage side, the electric diagram is modified to ascertain that all transistors can be made in the technology adapted to voltage $V_1$. For this purpose, it is provided, at least in the low portion of the amplifier (between output terminal 9 and ground 7), that none of the transistors of the low portion sees across its terminals a voltage greater than the voltage acceptable for the technology, especially when output terminal 9 is at the maximum level.

In the example of FIG. 4, three N-channel MOS transistors N31, N32, and N33 are in series between terminal 9 and the drain of transistor N25 having its source at ground 7. A same number of N-channel MOS transistors N35, N36, and N37 is series-connected between a current source 70 and the ground, current source 70 for example being connected to terminal 6 of application of voltage $V_1$. Transistors N35, N36, and N37 are diode-connected (interconnected gate and drain). Transistor N37 compensates for the gate-source voltage of transistor N25, itself set by input stage 20. The gates of transistors N36 and N33, as well as the gates of transistors N32 and N35, are interconnected. As a result, transistors N25, N32, and N33 only see a gate-source voltage between their terminals (between their gate and source). This gate-source voltage $V_{GS}$ (for example, approximately 0.5 volt) is set by current source 70 which sets the voltages across diode-connected transistors N35, N36, and N37, and thus voltages $V_{G32}$ and $V_{G33}$ of the gates of transistors N32 and N33. Voltage $V_{G33}$ corresponds to $2V_{GS}$ and voltage $V_{G32}$ corresponds to $3V_{GS}$.

To limit the voltage across transistor N31, a resistive dividing bridge (resistors R1 and R2 in series) is connected between terminal 9 and the gate of transistor N32, the midpoint of this dividing bridge being connected to the gate of transistor N31. The values of resistances R1 and R2 are selected to set voltage $V_{G31}$ of the gate of transistor N31, and thus the drain-source voltage of transistors N31 and N32. Resistances R1 and R2 thus have high values, so that the current which flows in bridge R1-R2 can be as low as possible and avoids disturbing the stage where gates $V_{G32}$ and $V_{G33}$ are biased and the output stage. The aim is to approximately distribute the potential difference between terminal 9 (output voltage $V_{OUT}$) and the source of transistor N32, to obtain identical drain-source voltages $V_{DS}$ for transistors N31 and N32. The drain-source voltage of transistor N32 can be written as: $V_{DS32}=V_{R2}+V_{GS32}-V_{GS31}$, where $V_{R2}$ is the voltage drop across resistor R2 and $V_{GS31}$ and $V_{GS32}$ are the respective gate-source voltages of transistors N31 and N32. Since the gate-source voltages are equal (set by biasing), $V_{DS32}=V_{R2}$. On the other hand, the drain-source voltage of transistor N31 can be written as: $V_{DS31}=V_{R1}+V_{GS31}$, where $V_{R1}$ is the voltage drop across resistor R1. The value of resistance R1 will thus be selected to be slightly smaller than the value of resistance R2.

In the example where power supply voltage $V_2$ is from two to three times greater than voltage $V_1$ (and thus to the voltage that low-voltage transistors can withstand), it is sufficient to divide the output voltage by two.

According to another example where voltage $V_2$ would be from three to four times greater than voltage $V_1$ (for example, a voltage $V_2$ on the order of 12 volts for a voltage $V_1$ on the order of 3.3 volts), two N-channel transistors in series between terminal 9 and transistor N32 and a dividing bridge of three resistors in series, having their respective midpoints driving the gates of these two transistors, are provided. Thus, each of these transistors only see one third of the output voltage swing thereacross.

It could have been devised to use a usual cascode assembly of N-channel transistors between terminal 9 and transistor N25. This would, however, result in using a larger number of transistors in series (at least 6 for an 8-volt voltage) with the risk of occurrence of distortion problems for signals of large amplitude.

In the circuit of FIG. 4, the capacitive stabilization element between terminal 24 and terminal 9 is formed of two capacitors C1 and C2 in series. Further, two resistors R3 and R4, in series between terminal 9 and the ground and having their junction point connected to the junction point of capacitors C1 and C2, form a dividing bridge to avoid that each of capacitors C1 and C2 experience too high a voltage at their terminals. This enables using the technology adapted to voltage $V_1$ to form the capacitors which would otherwise not be able to withstand voltage $V_2$. An additional resistor R (shown in dotted lines) is in series with capacitors C1 and C2.

Considering the upper portion of output stage 30 (between terminal 8 of application of voltage $V_2$ and output terminal 9), current source 26 (FIG. 2) is replaced with a cascode assembly of a P-channel MOS transistor P41 in series with a P-channel DRIFT-type transistor DP42. Such a transistor DP42 is a high-voltage transistor made in a lower-voltage technology, that is, it is capable of withstanding a voltage greater than the voltage withstood by the other transistors. For example, in a 3.3-volt technology ($V_1$), P-channel DRIFT transistors withstand approximately 6.5 volts. Transistor P41 is mirror-connected on a diode-connected transistor P43 while transistor DP42 is mirror-connected on a diode-connected transistor P44. Transistors P43 and P44 are in series with a current source 80 connected to ground 7. So that transistors P43, P44 and the transistors of current source 80 do not see a voltage greater than voltage $V_1$, diodes or other level-shifting elements, symbolized by a circuit 90, are interposed between transistor P44 and current source 80.

If the level difference between voltages $V_1$ and $V_2$ enables it, it is possible to only keep transistor DP42 and transistor P41 may be avoided on the high level side of the output stage. High-voltage transistor (DRIFT) DP42 alone withstands voltage $V_2$ minus the voltage drop in the N-channel transistors of the lower portion. However, in the discussed example of a 3.3-volt technology, transistor DP42 withstands approximately 6.5 volts and level $V_{G32}$ is on the order of 1.5 volt, which makes it necessary to add a transistor P41 in order to lower the voltage of a gate-source voltage $V_{GS}$. Similarly, for greater power supply voltages, several cascoded P-channel transistors may be associated in the upper portion of the stage, provided not to generate too much distortion.

Figure 5:
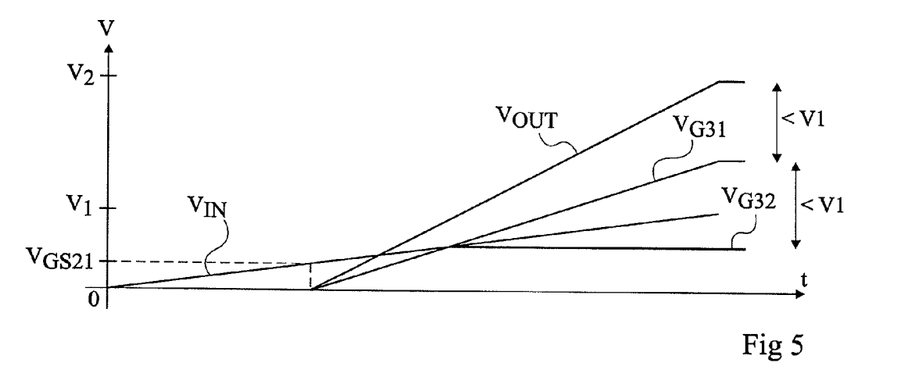
FIG. 5 illustrates the operation of the output stage of the amplifier of FIG. 4.

FIG. 5 is a timing diagram illustrating the operation of output stage 30, and more specifically of its lower portion. This timing diagram shows the values taken by voltages $V_{G31}$, $V_{G32}$, and $V_{OUT}$. To make the discussion clearer, a signal $V_{IN}$ in the form of a ramp between the ground (0) and voltage level $V_1$ is assumed. It should however be reminded that in practice, the signal is a variable analog signal (for example, a sinusoidal or pseudo-sinusoidal signal).

Voltages $V_{G31}$, $V_{G32}$, and $V_{OUT}$ start increasing from the time when voltage $V_{IN}$ reaches gate-source voltage $V_{GS21}$ of transistor N21 of the input stage. It should be noted that FIG. 5 is theoretical. In practice, level $V_{IN}$ can never be under level $V_{GS21}$ except when the amplifier is off. Voltages $V_{G31}$ and $V_{OUT}$ increase linearly (proportionally to voltage $V_{IN}$) from level $V_{GS21}$ with the amplitude ratio set by the dimensions and the biasing of the transistors. As soon as level $V_{IN}$ reaches a value corresponding to the level set by the biasing of transistors N32 and N33 (three times a gate-source voltage—$3V_{GS}$), voltage $V_{G32}$ is stable at this level.

Taking level $V_{G32}$ as a reference, voltage $V_{G31}$ approximately corresponds to half voltage $V_{OUT}$ as soon as voltage $V_{G32}$ is stable.

To simplify the representation of FIG. 5, no account has been taken of the voltage drops with respect to positive supply voltages $V_1$ and $V_2$ (it being a theoretical plot). It can be seen that the difference between levels $V_{G32}$ and $V_{G31}$, as well as between levels $V_{G31}$ and $V_{OUT}$, always remains smaller than voltage $V_1$, that is, the corresponding transistors never see a voltage greater than voltage $V_1$.

It could also have been devised to use a high-voltage N-channel transistor (N-channel DMOS transistor) in the lower portion of the amplifier. However, such a transistor has its bulk connected to the substrate, and thus to ground 7. Accordingly, transistor N25 would be cascode-connected and would approximately receive the output level minus a gate-source voltage. In the upper portion, the bulk of the P-channel DRIFT transistor is connected to its source, which makes the assembly of FIG. 4 possible.

To show that each transistor, including its bulk, sees no greater voltage, the connections of the respective transistor bulks have been shown in the drawings of the output stage. As can be seen, each transistor has its bulk connected to its source.

Figure 6:
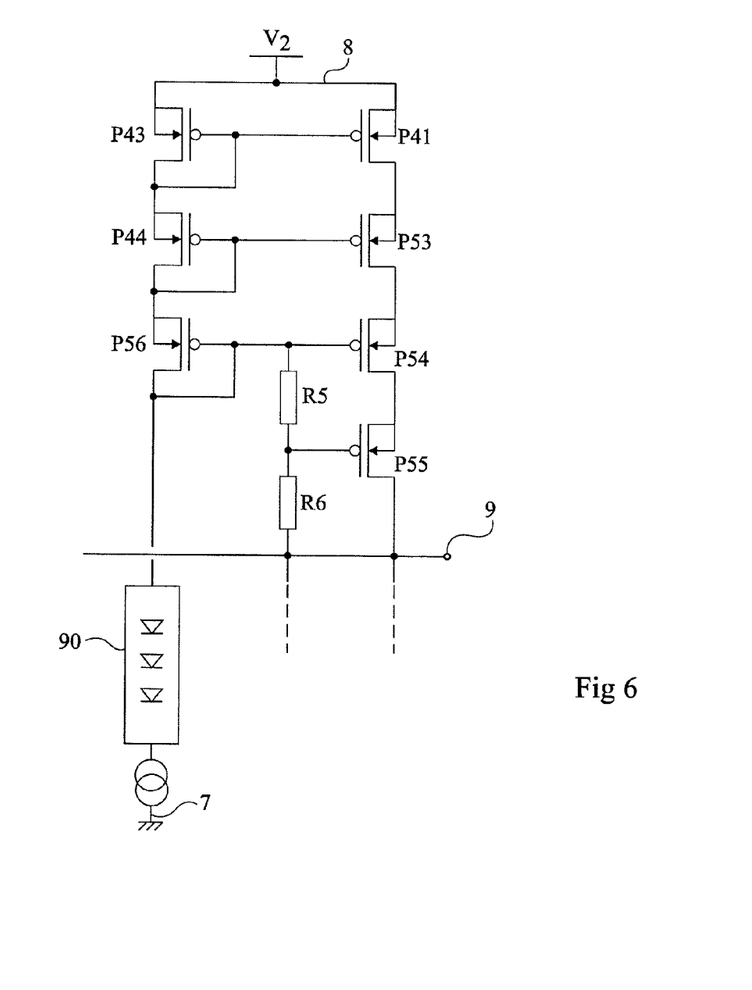
FIG. 6 partially shows a variation of the output stage of the amplifier of FIG. 4.

FIG. 6 shows a variation of the upper portion of the output stage in which an assembly similar to the assembly of the lower portion of FIG. 4 is formed. Thus, three P-channel MOS transistors P53, P54, and P55 are series-connected between transistor P41 and terminal 9. Transistors P41 and P53 are mirror-connected on series- and diode-connected transistors P43 and P44. Transistor P54 has its gate connected to that of a P-channel transistor P56, diode-connected between the drain of transistor P44 and the terminal of shifter circuit 90. A resistive dividing bridge (resistors R5 and R6 in series) is connected between the gate of transistor P54 and terminal 9. The midpoint of this resistive dividing bridge is connected to the gate of transistor P55. The operation of this assembly can be deduced from that discussed in relation with FIG. 4.

It will, however, be preferred to use a high-voltage P-channel MOS transistor (embodiment of FIG. 4) since it takes up a smaller surface area than three transistors (P53 to P55) and additional biasing transistor P56.

Figure 7:
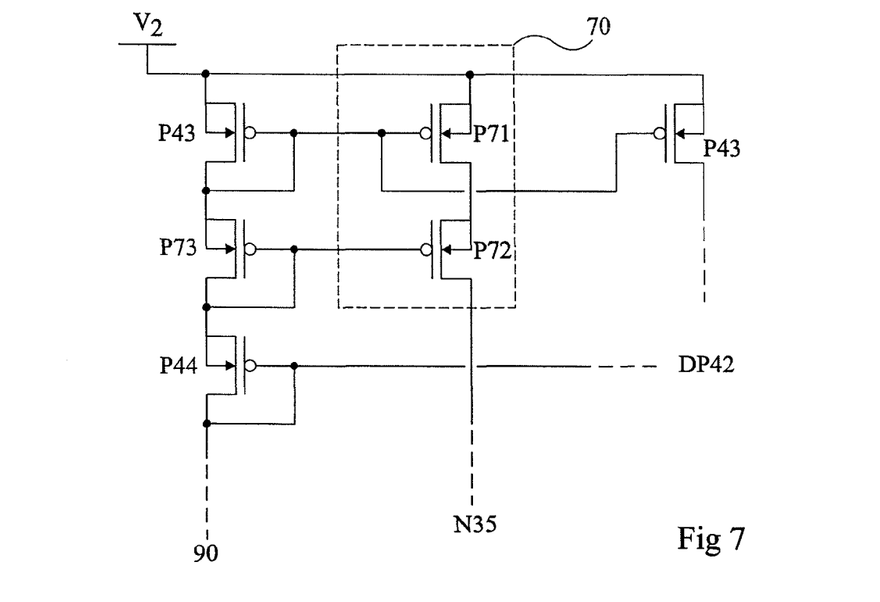
FIG. 7 shows an embodiment of a detail of the circuit of FIG. 4.

FIG. 7 shows an embodiment of current source 70 of FIG. 4 used to bias the transistors of the lower portion of the output stage. For example, the current source exploited by the upper portion is reused. Thus, a P-channel MOS transistor P71 is mirror-connected on transistor P43. This transistor is in series with another P-channel MOS transistor P72 having its drain connected to the drain of transistor N35 (not shown in FIG. 7). A P-channel transistor P73 is interposed between transistors P43 and P44. Transistor P73 is diode-connected and has its gate connected to that of transistor P72. In this example, current source 70 is powered with voltage $V_2$. Two transistors in series are enough, due to the fixed voltage imposed by the N-channel transistors of the lower portion, since this branch is a bias branch having voltages which do not vary according to the input level.

Figure 8:
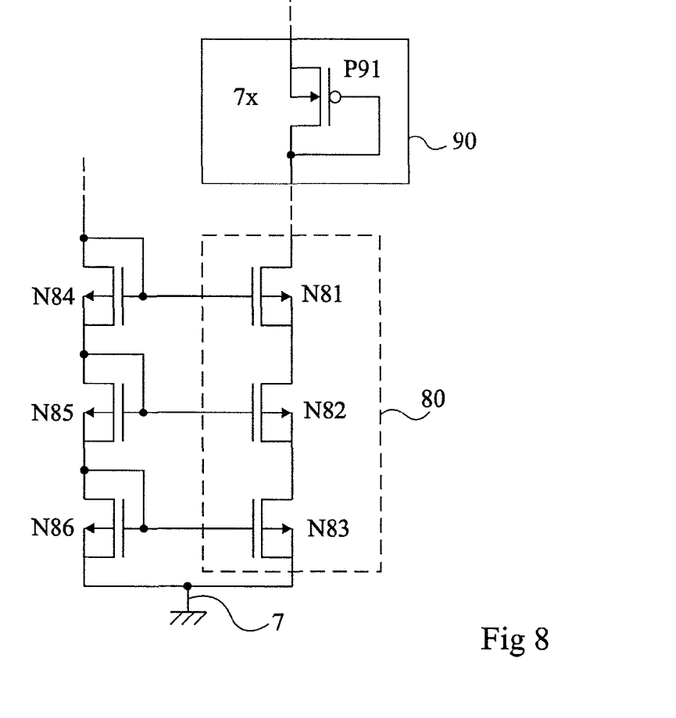
FIG. 8 shows an embodiment of another detail of the circuit of FIG. 4.

FIG. 8 illustrates an embodiment of current source 80 and of circuit 90.

Circuit 90 is formed of 7 diode- and series-connected P-channel MOS transistors P91. As a variation, simple diodes or resistive elements or any other level-shifting element may be used. Current source 80 is formed of three N-channel MOS transistors N81, N82, and N83 in series between the output of circuit 90 and ground 7. Each of these transistors is mirror-connected on another N-channel transistor N84, N85, and N86. Transistors N84, N85, and N86 are in series and diode-connected between a current source, not shown (at least one P-channel MOS transistor) of the upper portion, and terminal 8 of application of voltage $V_2$. Here again, three diode-connected transistors N84 to N86 are sufficient since it is a bias branch. Thus, for a voltage $V_2$ on the order of 8 volts, each of the transistors will never see a voltage greater than $V_1$.

It is now possible to integrate, within the same circuit, low-voltage audio processing circuits and amplification circuits under a greater voltage by using the low-voltage circuit technology. The above-described embodiments show that such an integration can be performed without generating any distortion in the signal and with an acceptable surface area increase. This surface area increase is anyways negligible as compared with the surface area required, on an electronic board, by two separate circuits. This further enables decreasing the cost.

Various embodiments have been described, and different variations and modifications will occur to those skilled in the art. In particular, the dimensions to be given to the transistors depend on the output currents set by the application. Similarly, the resistive and capacitive elements can easily be determined by those skilled in the art based on the functional indications given hereabove and on the application.

Further, although the present invention has been described in relation with an example of an amplifier for audio signals, it more generally applies as soon as similar problems are posed, for example, for the amplification of an analog signal where it is desired to integrate, within the same circuit, low-voltage elements and high-voltage elements in low-voltage technology.

Finally, although the present invention has been described in relation with positive supply voltages with respect to ground, it can be transposed to an application where the signal to be amplified has a negative biasing with respect to ground. The structure of the output stage remains identical, the ground being applied on terminal 8 and the negative voltage being applied on terminal 7. The structure of the input stage is different, to respect the provision of a signal $V_{IN}$ which is negative with respect to ground. Transforming such a differential input stage by replacing the P-channel transistors with N-channel transistors and conversely, to apply a negative voltage on transistor N25, is within the abilities of those skilled in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An output stage of an integrated class-A amplifier in a technology adapted to a first voltage and configured to be powered under a second voltage greater than the first voltage, comprising:
   one or more transistors of a first channel type between a first terminal of application of the second voltage and an output terminal of the stage; and
   transistors of a second channel type between the output terminal and a second terminal of application of the second voltage, comprising:
      a first transistor of the second channel type having its gate directly connected to an input terminal of the output stage, and
      at least a second transistor and a third transistor of the second channel type in series between the output terminal and said first transistor, the gate of the second transistor being coupled to a midpoint of a resistive dividing bridge between the output terminal and the gate of the third transistor, and the gate of the third transistor being biased to a fixed voltage.

2. The output stage of claim 1, wherein two capacitive elements in series couple the input terminal to the output terminal, a second resistive dividing bridge couples the output terminal to the second terminal of application of the second voltage, and a midpoint of the second resistive dividing bridge is coupled to a junction of the two capacitive elements.

3. The output stage of claim 1, wherein the transistors of the second channel type further comprise a fourth transistor interposed between the first and third transistors.

4. The output stage of claim 1, wherein the one or more transistors of the first channel type form a current source between said first terminal of application of the second voltage and the output terminal.

5. The output stage of claim 4, wherein said one or more transistors of the first channel type comprise at least one drift transistor of DRIFT type.

6. The output stage of claim 5, wherein said drift transistor is cascode-connected to at least a second transistor of the first channel type.

7. The output stage of claim 4, wherein the one or more transistors of the first channel type comprise first and second transistors of the first channel type coupled in series between the first terminal of application of the second voltage and the output terminal, the second transistor of the first channel type having its gate connected to a midpoint of a third resistive dividing bridge connected between a gate of the first transistor of the first channel type and the output terminal.

8. A class-A amplifier, comprising the output stage of claim 1.

9. An audio signal processing chain comprising, for each path, the amplifier of claim 8.

10. An amplifier stage configured to receive an input signal on an input terminal and to provide an output signal on an output terminal, a maximum amplitude of the input signal being less than or equal to a first voltage, a maximum amplitude of the output signal being less than or equal to a second voltage, the second voltage being greater than the first voltage, the amplifier stage comprising:
  transistors of a second channel type coupled between the output terminal and a reference terminal, at least one of the transistors of the second channel type having a withstand voltage less than the second voltage, the transistors of the second channel type comprising:
    a first transistor having its gate coupled to the input terminal, and
    at least two transistors coupled between the output terminal and the first transistor,
  the at least two transistors comprising a second transistor and a third transistor,
  wherein:
    a resistive dividing bridge is coupled between the output terminal and a gate of the third transistor,
    a gate of the second transistor is coupled to an interior node of the resistive dividing bridge, and
    the gate of the third transistor is coupled to one or more circuit elements configured to bias the gate of the third transistor to a fixed voltage,
    capacitive elements couple the input terminal to the output terminal,
    a second resistive dividing bridge couples the output terminal to the reference terminal, and
    a midpoint of the second resistive dividing bridge is coupled to a junction of the capacitive elements.

11. The amplifier stage of claim 10, wherein the transistors of the second channel type further comprise a fourth transistor interposed between the first and third transistors.

12. The amplifier stage of claim 10, wherein
  the gate of the first transistor is directly connected to the input terminal, and
  the at least two transistors are connected in series.

13. An amplifier stage configured to receive an input signal on an input terminal and to provide an output signal on an output terminal, a maximum amplitude of the input signal being less than or equal to a first voltage, a maximum amplitude of the output signal being less than or equal to a second voltage, the second voltage being greater than the first voltage, the amplifier stage comprising:
  transistors of a second channel type coupled between the output terminal and a reference terminal, at least one of the transistors of the second channel type having a withstand voltage less than the second voltage, the transistors of the second channel type comprising:
    a first transistor having its gate coupled to the input terminal, and
    at least two transistors coupled between the output terminal and the first transistor,
  the at least two transistors comprising a second transistor and a third transistor,
  wherein:
    a resistive dividing bridge is coupled between the output terminal and a gate of the third transistor,
    a gate of the second transistor is coupled to an interior node of the resistive dividing bridge, and
    the gate of the third transistor is coupled to one or more circuit elements configured to bias the gate of the third transistor to a fixed voltage,
  the amplifier stage further comprises one or more transistors of a first channel type coupled between a power supply terminal and the output terminal, at least one of the one or more transistors of the first channel type having a withstand voltage less than the second voltage, and
  the power supply terminal is configured to receive a power supply signal having the second voltage.

14. The amplifier stage of claim 13, wherein the one or more transistors of the first channel type comprise a drift transistor of DRIFT type.

15. The amplifier stage of claim 14, wherein the drift transistor is cascode-connected to a transistor of the one or more transistors of the first channel type.

16. The amplifier stage of claim 13, wherein at least one of the one or more transistors of the first channel type forms a current source between the power supply terminal and the output terminal.

17. The amplifier stage of claim 13, wherein the one or more transistors of the first channel type comprise first and second transistors of the first channel type coupled in series between the power supply terminal and the output terminal, the second transistor of the first channel type having its gate connected to a midpoint of a third resistive dividing bridge connected between a gate of the first transistor of the first channel type and the output terminal.

18. An amplifier stage configured to receive an input signal on an input terminal and to provide an output signal on an output terminal, a maximum amplitude of the input signal being less than or equal to a first voltage, a maximum amplitude of the output signal being less than or equal to a second voltage, the second voltage being greater than the first voltage, the amplifier stage comprising:
  transistors of a second channel type coupled between the output terminal and a reference terminal, at least one of the transistors of the second channel type having a withstand voltage less than the second voltage, the transistors of the second channel type comprising:
    a first transistor having its gate coupled to the input terminal, and
    at least two transistors coupled between the output terminal and the first transistor,
  the at least two transistors comprising a second transistor and a third transistor; and
  bias means for biasing of the third transistor to a fixed voltage, and for biasing the second and third transistors so that a gate-source voltage of the third transistor is equal to a gate-source voltage of the second transistor,
  wherein capacitive elements couple the input terminal to the output terminal, a second resistive dividing bridge couples the output terminal to the reference terminal, and a midpoint of the second resistive dividing bridge is coupled to a junction of the capacitive elements.

19. An amplifier stage configured to receive an input signal on an input terminal and to provide an output signal on an output terminal, a maximum amplitude of the input signal being less than or equal to a first voltage, a maximum amplitude of the output signal being less than or equal to a second voltage, the second voltage being greater than the first voltage, the amplifier stage comprising:

transistors of a second channel type coupled between the output terminal and a reference terminal, at least one of the transistors of the second channel type having a withstand voltage less than the second voltage, the transistors of the second channel type comprising:
a first transistor having its gate coupled to the input terminal, and
at least two transistors coupled between the output terminal and the first transistor,
the at least two transistors comprising a second transistor and a third transistor;
bias means for biasing of the third transistor to a fixed voltage, and for biasing the second and third transistors so that a gate-source voltage of the third transistor is equal to a gate-source voltage of the second transistor; and
one or more transistors of a first channel type coupled between a power supply terminal and the output terminal, at least one of the one or more transistors of the first channel type having a withstand voltage less than the second voltage, wherein the power supply terminal is configured to receive a power supply signal having the second voltage.

20. The amplifier stage of claim 19, wherein the one or more transistors of the first channel type comprise a drift transistor of DRIFT type.

21. The amplifier stage of claim 20, wherein the drift transistor is cascode-connected to a transistor of the one or more transistors of the first channel type.

22. The amplifier stage of claim 19, wherein at least one of the one or more transistors of the first channel type forms a current source between the power supply terminal and the output terminal.

23. The amplifier stage of claim 19, wherein the one or more transistors of the first channel type comprise first and second transistors of the first channel type coupled in series between the power supply terminal and the output terminal, the second transistor of the first channel type having its gate connected to a midpoint of a third resistive dividing bridge connected between a gate of the first transistor of the first channel type and the output terminal.

24. A signal processing system comprising:
a class-A amplifier comprising a first amplifier stage and a second amplifier stage,
wherein:
an input terminal of the second amplifier stage is coupled to an output terminal of the first amplifier stage;
the first amplifier stage is configured to provide a signal on the output terminal of the first amplifier stage, a maximum amplitude of the signal being less than or equal to a first voltage;
the second amplifier stage is configured to provide an output signal on an output terminal of the second amplifier stage, a maximum amplitude of the output signal being less than or equal to a second voltage, the second voltage being greater than the first voltage;
the second amplifier stage comprises:
transistors of a second channel type coupled between the output terminal of the second amplifier stage and a reference terminal, at least one of the transistors of the second channel type having a withstand voltage less than the second voltage, the transistors of the second channel type comprising:
a first transistor having its gate coupled to the input terminal, and
at least two transistors coupled between the output terminal of the second amplifier stage and the first transistor, the at least two transistors comprising a second transistor and a third transistor;
a resistive dividing bridge is coupled between the output terminal of the second amplifier stage and a gate of the third transistor;
a gate of the second transistor is coupled to an interior node of the resistive dividing bridge; and
the gate of the third transistor is coupled to one or more circuit elements configured to bias the gate of the third transistor to a fixed voltage.

25. The signal processing system of claim 24, further comprising signal processing elements configured to implement a signal processing path, the signal processing path comprising the class-A amplifier.

26. The signal processing system of claim 24, wherein capacitive elements couple the input terminal to the output terminal of the second amplifier stage, a second resistive dividing bridge couples the output terminal of the second amplifier stage to the reference terminal, and a midpoint of the second resistive dividing bridge is coupled to a junction of the capacitive elements.

27. The signal processing system of claim 24, wherein the transistors of the second channel type further comprise a fourth transistor interposed between the first and third transistors.

28. The signal processing system of claim 24, wherein
the amplifier stage further comprises one or more transistors of a first channel type coupled between a power supply terminal and the output terminal of the second amplifier stage, at least one of the one or more transistors of the first channel type having a withstand voltage less than the second voltage, and
the power supply terminal is configured to receive a power supply signal having the second voltage.

29. The signal processing system of claim 28, wherein the one or more transistors of the first channel type comprise a drift transistor of DRIFT type.

30. The signal processing system of claim 29, wherein the drift transistor is cascode-connected to a transistor of the one or more transistors of the first channel type.

31. The signal processing system of claim 28, wherein at least one of the one or more transistors of the first channel type forms a current source between the power supply terminal and the output terminal of the second amplifier stage.

32. The signal processing system of claim 28, wherein the one or more transistors of the first channel type comprise first and second transistors coupled in series between the power supply terminal and the output terminal of the second amplifier stage, the second transistor of the first channel type having its gate connected to a midpoint of a second resistive dividing bridge connected between a gate of the first transistor of the first channel type and the output terminal of the second amplifier stage.

33. The signal processing system of claim 24, wherein
the gate of the first transistor is directly connected to the input terminal, and
the at least two transistors are connected in series.

* * * * *